US006359498B1

United States Patent
Kurihara et al.

(10) Patent No.: US 6,359,498 B1
(45) Date of Patent: Mar. 19, 2002

(54) TEMPERATURE COMPENSATION AGC CIRCUIT WITH TEMPERATURE CHARACTERISTIC OF AGC VOLTAGE

(75) Inventors: Yuji Kurihara; Yuichiro Yamagata; Toshiya Ikarashi, all of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/559,900

(22) Filed: Apr. 26, 2000

(30) Foreign Application Priority Data

Apr. 30, 1999 (JP) .......................................... 11-124469

(51) Int. Cl.[7] .............................................. H01L 35/00
(52) U.S. Cl. ...................................... 327/513; 330/289
(58) Field of Search ................................ 327/513, 512; 330/254, 256, 289, 266, 272, 261, 267, 273, 278

(56) References Cited

U.S. PATENT DOCUMENTS

| | | | | |
|---|---|---|---|---|
| 4,401,898 A | * | 8/1983 | Sommerer ................... | 327/513 |
| 5,030,924 A | * | 7/1991 | Fritz .......................... | 330/256 |
| 5,162,678 A | | 11/1992 | Yamasaki | |
| 5,177,453 A | * | 1/1993 | Russell et al. ............... | 330/284 |
| 5,352,944 A | * | 10/1994 | Sacchi et al. ................ | 327/103 |
| 5,423,081 A | | 6/1995 | Thiele et al. ............... | 455/116 |
| 5,687,195 A | | 11/1997 | Hwang et al. .............. | 375/345 |
| 5,796,309 A | * | 8/1998 | Nguyen ...................... | 330/289 |
| 5,873,029 A | * | 2/1999 | Grondahl et al. ............ | 455/126 |
| 5,994,961 A | * | 11/1999 | Lunn et al. .................. | 330/254 |
| 6,108,527 A | | 8/2000 | Urban et al. ................ | 455/115 |

FOREIGN PATENT DOCUMENTS

| | | |
|---|---|---|
| DE | 197 10 474 A | 1/1998 |
| FR | 2 539 932 | 7/1984 |

\* cited by examiner

*Primary Examiner*—Timothy P. Callahan
*Assistant Examiner*—Hai L. Nguyen
(74) *Attorney, Agent, or Firm*—Brinks Hofer Gilson & Lione

(57) ABSTRACT

There is provided an AGC circuit with temperature compensation which has simplified a circuit configuration of a temperature compensation circuit unit and has reduced variation of gain characteristic of the stage to be controlled in its gain for variation of ambient temperature. This AGC circuit is composed of a signal detecting unit including a detection diode to generated a detected voltage in proportion to a signal level, a compensation voltage generating unit including a temperature compensation diode to generate a temperature compensation voltage and a differential amplifying unit forming an AGC voltage from a difference voltage of the detected voltage and temperature compensation voltage to supply the AGC voltage to the gain amplifying stage to be controlled. Thereby, the AGC operation can be performed and change of gain of the gain amplifying stage to be controlled due to variation of ambient temperature can be controlled by giving temperature characteristic to the AGC voltage through given difference between the bias current flowing into the detection diode and the bias current flowing into the temperature compensation diode.

13 Claims, 3 Drawing Sheets

FIG.1
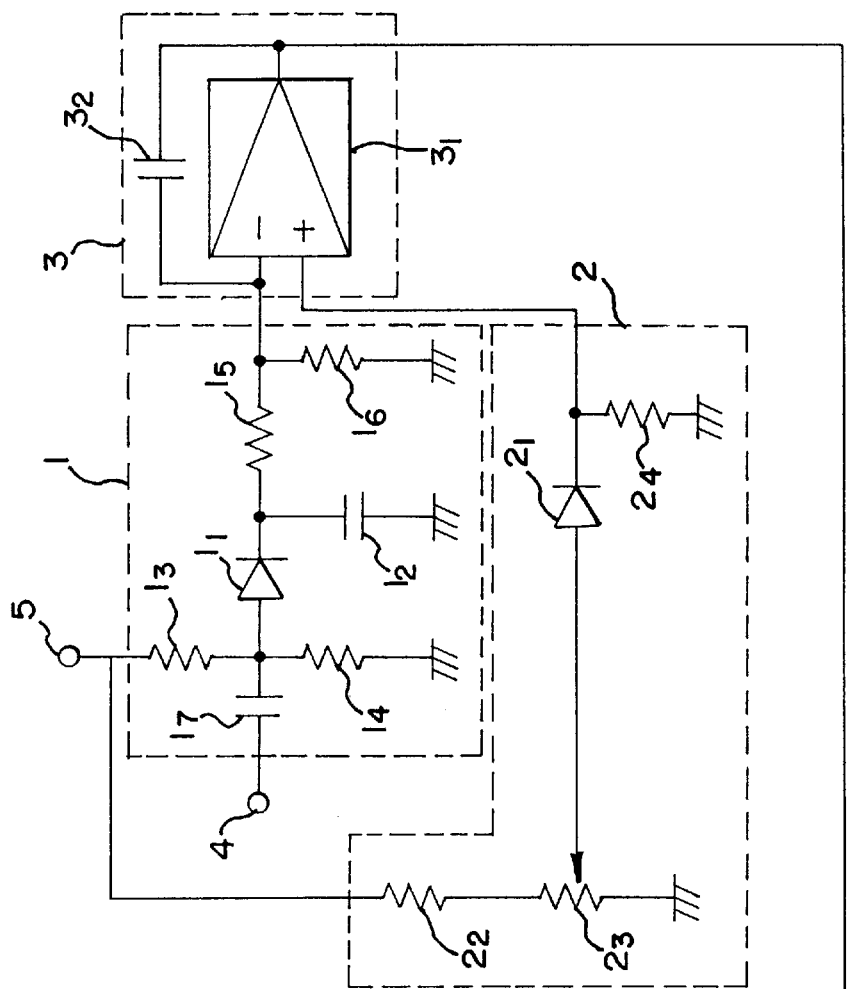
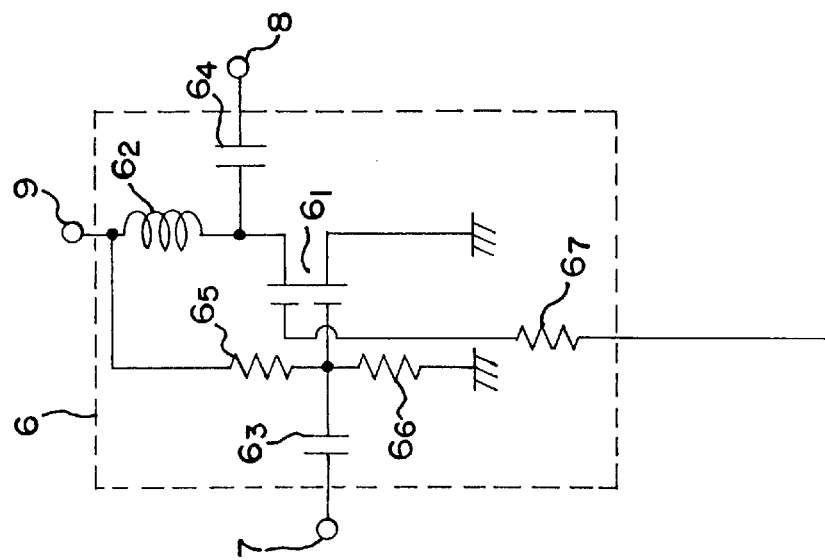

TEMPERATURE COMPENSATION AGC CIRCUIT WITH TEMPERATURE CHARACTERISTIC OF AGC VOLTAGE

BACKGROUND OF THE INVENTION

1. Field of the Invention

The present invention relates to a temperature compensation circuit of an AGC (Automatic Gain Control) circuit and particularly to a temperature compensation AGC circuit which is capable of introducing a compensation voltage generating unit of the simplified structure for generating a temperature compensation voltage by adequately selecting a bias current value of a temperature compensation diode.

2. Description of the Related Art

In general, an electronic tuner comprises at least a high frequency amplifying stage for amplifying the received high frequency signal, a frequency converting stage for mixing frequencies of the amplified high frequency signal and a local oscillation signal to generate an intermediate frequency signal, an intermediate frequency amplifying stage for selectively amplifying the intermediate frequency signal, detecting (demodulating) stage for obtaining a modulated signal by detecting (demodulating) the amplified intermediate frequency signal, and a receiving signal selecting unit for selecting and setting the frequency of the local oscillation signal in order to receive the signal of desired frequency.

Moreover, even if the received high frequency signal level has changed to a large extent in such electronic tuner, an AGC (Automatic Gain Control) circuit is generally provided in view of controlling variation of the demodulated signal level output from the detecting (demodulating) stage to a comparatively small value. This AGC circuit forms an AGC voltage from the demodulated signal obtained by the detecting (demodulating) stage and supplies this AGC voltage to the high frequency amplifying stage or intermediate frequency amplifying stage. Moreover, the AGC circuit also operates to control the gain of the high frequency amplifying stage or the intermediate frequency amplifying stage with the supplied AGC voltage. Therefore, when the received high frequency signal level has changed, variation of the intermediate frequency signal level to be supplied to the detecting (demodulating) stage is compressed to a large extent.

FIG. 3 is a circuit diagram illustrating an example of the structure of AGC circuit to be used in the existing electronic tuner.

As illustrated in FIG. 3, the AGC circuit is composed of a detecting circuit unit 31, a temperature compensation circuit unit 32, and a differential amplifying unit 33. The detecting circuit unit 31 is connected, at its input end, to an intermediate frequency signal input terminal 35, to one input terminal of the differential amplifying unit 33 at its output terminal and to a power source terminal 36 at its power source supply terminal. The temperature compensation circuit unit 32 is connected to the power source terminal 36 at its power source supplying terminal and connected to the other input terminal of the differential amplifying unit 33 at its output terminal. The differential amplifying unit 33 is connected to the control terminal of the high frequency amplifying stage 34 at its output terminal. Moreover, the high frequency amplifying stage 34 is connected to the high frequency signal input terminal 37 at its input terminal, also connected to the high frequency signal output terminal 38 at its output terminal and connected to the power source terminal 39 at its power source supplying terminal.

Here, the detecting circuit unit 31 is provided with a detection diode $31_1$, a branching capacitor $31_2$, four resistors $31_3$, $31_4$, $31_5$, $31_6$ and a coupling capacitor $31_7$ and these circuit elements $31_1$, to $31_7$, are connected as illustrated in the figure. The temperature compensation circuit unit 32 is provided with a temperature compensation diode $32_1$, a branching-capacitor $32_2$, four resistors $32_3$, $32_4$, $32_5$, $32_6$, a variable resistor $32_7$ and these circuit elements $32_1$, to $32_7$ are connected as illustrated in FIG. 3. The differential amplifying unit 33 is provided with an operational amplifier $33_1$, and a feedback capacitor $33_2$ and these circuit elements $33_1$, and $33_2$ are connected as illustrated in FIG. 3. The high frequency amplifying stage 34 is provided with a double gate field effect transistor (FET) $34_1$, a load inductor $34_2$, two coupling capacitors $34_3$, $34_4$, resistors $34_5$, $34_6$, and a buffer resistor $34_7$, and these circuit elements $34_1$, to $34_7$, are connected as illustrated in FIG. 3.

In this AGC circuit, a structure of the detecting circuit unit 31 is identical to a structure of the temperature compensation circuit unit 32, except for the point that a variable resistor $32_7$ is connected to the temperature compensation circuit unit 32, and the detection diode $31_1$ and temperature compensation diode $32_1$ have the identical characteristics.

The AGC circuit in the structure explained above operates as explained below.

The power source voltage supplied to the power source terminal 36 is divided by the four resistors $31_3$, $31_4$, $31_5$, $31_6$ and the divided voltage is then supplied to the detection diode $31_1$ of the detecting circuit unit 31 as a bias voltage to set the operating point of the detection diode $31_1$. Moreover, in the temperature compensation diode $32_1$ of the temperature compensation circuit unit 32, the power source voltage supplied to the power source terminal 36 is divided by four resistors $32_3$, $32_4$, $32_5$, $32_6$ and a variable resistor $32_7$ and the divided voltage is then supplied to the temperature compensation diode $32_1$ as a bias voltage to set the operating point of the temperature compensation diode $32_1$. In this case, the operating point of the temperature compensation diode $32_1$ can be set identical to the operating point of the detection diode $31_1$ by adjusting the variable resistor $32_7$.

When the intermediate frequency signal is supplied to the intermediate frequency signal input terminal 35 under the setting conditions explained above, this intermediate frequency signal is detected by the detection diode $31_1$ of the detecting circuit unit 31 and moreover is smoothed by the branching capacitor $31_2$. Thereafter, this intermediate frequency signal is divided by a couple of resistors $31_5$, $31_6$ and is then supplied to the inverted input terminal (−) of the operational amplifier $33_1$ of the differential amplifying unit 33 as the first DC voltage. In addition, when the power source voltage supplied to the power source terminal 36 is also supplied to the temperature compensation circuit unit 32, this power source voltage is then divided by two resistors $32_3$, $32_4$ and the variable resistor $32_7$ and is further divided by two resistors $32_5$, $32_6$ through the temperature compensation diode $32_1$. Thereafter, this divided power source voltage is supplied to the non-inverted input terminal (+) of the operational amplifier $33_1$ as the second DC voltage. The operational amplifier 33 differentially amplifies the first DC voltage and the second DC voltage supplied to two input terminals and generates the AGC voltage (positive voltage) including a differential voltage element of the first DC voltage and second DC voltage at the output terminal. This AGC voltage is then supplied to the high frequency amplifying stage 34 from the differential amplifying unit 33.

When the AGC voltage is supplied to the high frequency amplifying stage 34, it is then supplied to one gate of the double gate FET $34_1$ via the buffer resistor $34_7$. In this case, the high frequency signal supplied to the high frequency signal input terminal 37 is then supplied to the other gate of the double gate FET $34_1$ via the coupling capacitor $34_3$ and is then amplified by the double gate FET $34_1$. The amplified high frequency signal is then supplied to the high frequency signal output terminal 37 via the coupling capacitor $34_4$.

Here, when the high frequency signal level to be input to the high frequency amplifying stage 34 becomes high, the high frequency signal level output from the high frequency amplifying stage 34 also becomes high and simultaneously the intermediate frequency signal level to be input to the detecting circuit 31 also becomes high, resulting in increase of the first DC voltage to be supplied to the inverted input terminal (−) of the operational amplifier $33_1$. However, since the second DC voltage to be supplied to the non-inverted input terminal (+) of the operational amplifier $33_1$ is constant, the AGC voltage output from the operational amplifier $33_1$ is reduced in its positive voltage element and therefore substantially becomes low level. When this low level AGC voltage is supplied to the double gate FET $34_1$ of the high frequency amplifying stage 34, signal gain of the double gate FET $34_1$ is lowered as much as the reduction of the AGC voltage. Therefore, the high frequency signal level output from the high frequency amplifying stage 34 is also lowered.

Meanwhile, when the high frequency signal level to be input to the high frequency amplifying stage 34 is lowered, the high frequency signal level output from the high frequency amplifying stage 34 is also lowered. As a result, the intermediate frequency signal level to be input to the detecting circuit unit 31 is also reduced and thereby the first DC voltage to be supplied to the inverted input terminal (−) of the operational amplifier $33_1$ is lowered and the positive element of the AGC voltage output from the operational amplifier $33_1$ is increased and substantially becomes large. When this large AGC voltage is supplied to the double gate FET $34_1$ of the high frequency amplifying stage 34, signal gain of the double gate FET $34_1$ in increased as much as increase of the AGC voltage and thereby the high frequency signal level output from the high frequency amplifying stage 34 is also increased.

As explained above, when the high frequency signal level to be input to the high frequency amplifying stage 34 is increased, gain of the high frequency amplifying stage 34 is reduced by the AGC voltage and when the high frequency signal level to be input to the high frequency amplifying stage 34 is reduced, gain of the high frequency amplifying stage 34 is increased by the AGC voltage to realize the predetermined AGC operation.

The reason why the detecting circuit unit 31 and temperature compensation circuit unit 32 of almost identical structure are used and the detection diode $31_1$ and temperature compensation diode $32_1$ are used in the AGC circuit of the related art is that since the detection diode $31_1$ has the temperature characteristic, if the temperature compensation circuit unit 32 is not used, the AGC voltage varies for the change of ambient temperature but change of AGC voltage for variation of ambient temperature is canceled due to the output voltage of the temperature compensation circuit unit 32 provided with the temperature compensation diode $32_1$ having the characteristic identical to that of the detection diode $31_1$ in view of attaining the constant AGC voltage for variation of ambient temperature.

The AGC circuit of the related art uses the temperature compensation circuit unit of the structure identical to that of the detection circuit unit 31 to conduct the predetermined temperature compensation by controlling variation of the AGC voltage for the change of ambient temperature. However, since the temperature compensation circuit unit 32 is required to have the structure identical to the detection circuit unit 31, it is impossible to avoid that the circuit configuration of the temperature compensation circuit unit 32 is comparatively complicated.

Moreover, the AGC circuit of the related art conducts the predetermined temperature compensation by controlling the change of AGC voltage for variation of ambient temperature but cannot conduct temperature compensation even for gain characteristic of the high frequency amplifying stage which varies for change of ambient temperature. As a result, gain variation of the high frequency amplifying stage for change of the ambient temperature cannot be eliminated.

SUMMARY OF THE INVENTION

The present invention has been proposed considering the technical background as explained above and it is therefore an object of the present invention to provide a temperature compensation AGC circuit which simplifies the circuit configuration of the temperature compensation circuit unit and eliminates variation of gain characteristic of the stage to be controlled in its gain for change of ambient temperature.

In order to achieve the object explained above, the temperature compensation AGC circuit of the present invention comprises a signal detecting unit including the detection diode to generate a detection voltage in proportion to the signal level, a compensation voltage generating unit including the temperature compensation diode to generate temperature compensation voltage, and a differential amplifying unit to generate the AGC voltage from a difference voltage between the detection voltage and temperature compensation voltage and to supply such AGC voltage to a gain amplifying stage to be controlled. By giving the temperature characteristic to the AGC voltage through given difference between the bias current flowing through the detection diode and the bias current flowing through the temperature compensation diode, change of gain of the gain amplifying stage to be controlled depending on change of ambient temperature is controlled.

As a preferable example of the means explained above, the compensation voltage generating unit is composed of the temperature compensation diode and a variable voltage dividing circuit to supply a bias current to this temperature compensation diode.

As another preferable example of the means explained above, the detection diode and the temperature compensation diode have the identical temperature characteristic.

As another preferable example of the means explained above, the bias current flowing into the temperature compensation diode is set lower than the bias current flowing into the detection diode.

In above means, the AGC voltage which changes a little for change of ambient temperature and this AGC voltage is supplied to the amplifying stage to be controlled in its gain in order to control change of gain of the amplifying stage to be controlled in its gain for change of ambient temperature by simplifying the circuit configuration of the compensation voltage generating unit and giving difference between the bias current values flowing into the detection diode and temperature compensation diode, namely giving difference between the operation points of the temperature compensation diode and detection diode.

As explained above, according to this means, it is now possible to obtain the AGC circuit which not only simplifies the circuit configuration of compensation voltage generating unit but also assure sufficient temperature compensation for change of ambient temperature.

BRIEF DESCRIPTION OF THE DRAWINGS

FIG. 1 is a circuit configuration diagram illustrating a preferred embodiment of the AGC circuit in which temperature compensation is executed depending on the present invention.

DESCRIPTION OF THE PREFERRED EMBODIMENTS

Figure 2:
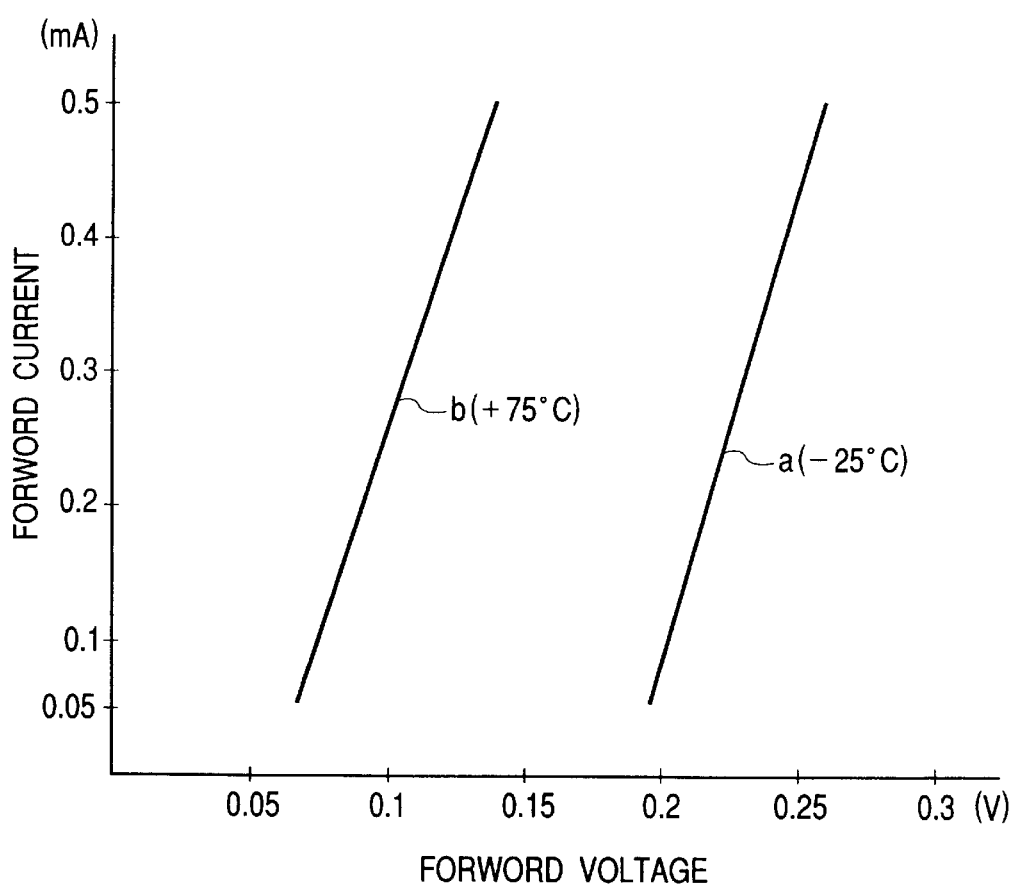
FIG. 2 is a characteristic diagram illustrating an example of the forward voltage vs. current characteristic when ambient temperature is changed as a parameter for the diode used in the AGC circuit of FIG. 1.
Figure 3:
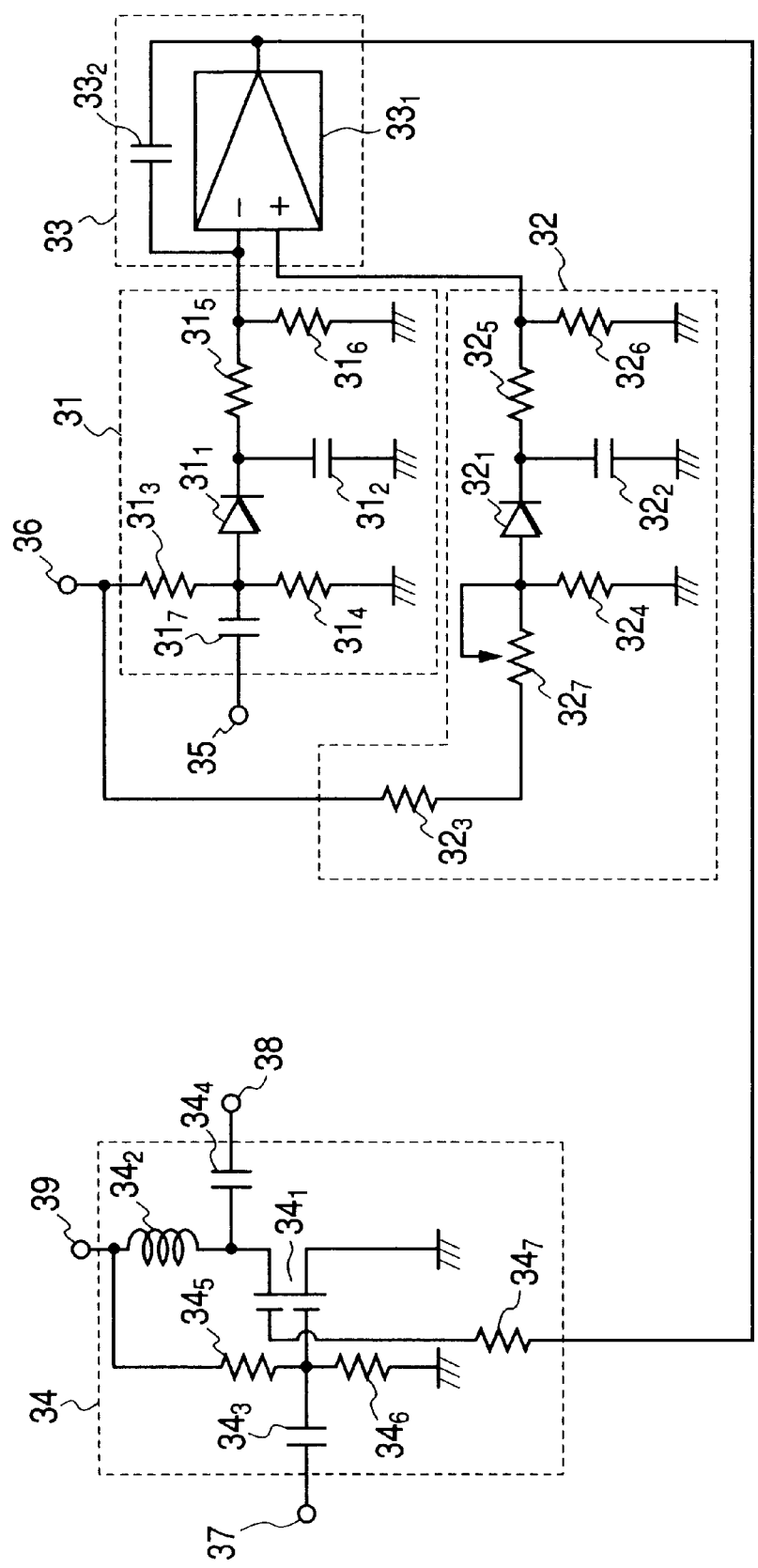
FIG. 3 is a circuit diagram illustrating an example of the configuration of the AGC circuit in which temperature compensation is executed depending on the related art.

The preferred embodiment of the present invention will be explained below with reference to the accompanying drawings.

FIG. 1 is a circuit configuration diagram illustrating a preferred embodiment of the AGC circuit in which temperature compensation is executed depending on the present invention.

As illustrated in FIG. 1, the AGC circuit based on this embodiment is composed of a detecting circuit unit 1, a temperature compensation circuit unit 2 and a differential amplifying unit 3. Moreover, the detecting circuit unit 1 is connected to an intermediate frequency signal input terminal 4 at the input terminal, connected to one input terminal of the differential amplifying unit 3 at the output terminal and connected to a power source terminal 5 at the power source supply terminal. The temperature compensation circuit unit 2 is connected to the power source terminal 5 at the power source supply terminal and to the other input terminal of the difference amplifying unit 3 at the output terminal. The differential amplifying unit 3 is connected to a control terminal of a high frequency amplifying stage 6 as the gain amplifying stage to be controlled at the output terminal. The high frequency amplifying stage 6 is connected to a high frequency signal input terminal 7 at the input terminal, connected to a high frequency signal output terminal 8 at the output terminal and connected to a power source terminal 9 at the power source supply terminal.

In this case, the detecting circuit unit 1 is provided with a detection diode $1_1$, a branching capacitor $1_2$, four resistors $1_3$, $1_4$, $1_5$, $1_6$ and a coupling capacitor $1_7$. The temperature compensation circuit unit 2 is provided with a temperature compensation diode $2_1$, a resistor $2_2$, a variable resistor $2_3$ and a resistor $2_4$. The differential amplifying unit 3 is provided with an operational amplifier $3_1$ and a feedback capacitor $3_2$. The high frequency amplifying stage 6 is provided with a double gate field effect transistor (FET) $6_1$, a load inductor $6_2$, two coupling capacitors $6_3$, $6_4$, resistors $6_5$, $6_6$ and a buffer resistor $6_7$.

In the detecting circuit unit 1, the detection diode $1_1$ is respectively connected, at the anode, to the input terminal through the coupling capacitor $1_7$, to the power source supply terminal through the resistor $1_3$ and to the ground point through the resistor $1_4$ and also connected respectively, at the cathode, to the ground point through the branching capacitor $1_2$ and to the output terminal through the resistor $1_5$. The resistor $1_6$ is connected between the output terminal and ground point. In the temperature compensation circuit unit 2, the temperature compensation diode $2_1$ is connected, at the anode, to a sliding terminal of the variable resistor $2_3$ and also connected, at the cathode, to the output terminal. The variable resistor $2_3$ is connected, at one terminal, to the power source supply terminal through the resistor $2_2$ and to the ground point at the other terminal. The resistor $2_4$ is connected, at one terminal, to the cathode of the temperature compensation diode $2_1$ and to the ground point at the other terminal. In the differential amplifying unit 3, the operational amplifier $3_1$ is connected, at the inverted input terminal (−) to a first input terminal, also connected, at the non-inverted input terminal (+) to a second input terminal and connected, at the output terminal, to the high frequency amplifying stage 6. The feedback capacitor $3_2$ is connected, at one terminal, to the inverted input terminal (−) of the operational amplifier $3_1$ and also connected, at the other terminal, to the output terminal of the operational amplifier $3_1$.

Moreover, in the high frequency amplifying stage 6, the double gate FET $6_1$ is respectively connected, at the first gate, to the control terminal through the buffer resistor $6_7$, also connected, at the second gate, to the input terminal through the coupling capacitor $6_3$, to the power source supply terminal through the resistor $6_5$ and to the ground point through the resistor $6_6$ and also connected, at the drain, to the power source supply terminal through the load inductor $6_2$ and to the output terminal through the coupling capacitor $6_4$ and connected in direct, at the source, to the ground point.

Moreover, the detection diode $1_1$ of the detecting circuit unit 1 and the temperature compensation diode 21 of the temperature compensation circuit unit 2 should have the identical voltage vs. current characteristic and the resistance values of four resistors $1_3$, $1_4$, $1_5$, $1_6$ and resistance values of the resistor $2_2$, variable resistor $2_3$ must be selected so that the bias current Id flowing into the detection diode $1_1$ becomes $1/10$ the bias current Ic flowing into the temperature compensation diode $2_1$, for example, when the bias current Id is 0.50 mA, the bias current Ic becomes 0.05 mA.

The AGC circuit of the structure explained above operates as follows.

When the intermediate frequency signal is supplied to the intermediate frequency signal input terminal 4, the intermediate frequency signal is detected by the detection diode $1_1$ of the detecting circuit unit 1. Moreover, the detected intermediate frequency signal is then smoothed by the branching capacitor $1_2$ and thereafter it is divided by two resistors $1_5$, $1_6$ and is then supplied, as the first DC voltage to the inverted input terminal (−) of the operational amplifier $3_1$ of the differential amplifying unit 3. In addition, when the power source voltage which is supplied to the power source terminal 5 is also supplied to the temperature compensation circuit unit 2, the power source voltage is divided by the resistor $2_2$ and variable resistor $2_3$ and after this divided voltage gives a bias current Ic to the temperature compensation diode $2_1$, it is then supplied as the second DC voltage to the non-inverted input terminal (+) of the operational amplifier $3_1$. The operational amplifier 3 differentially amplifies the first DC voltage and second DC voltage supplied to the two input terminals to generate at the output terminal the AGC voltage (positive voltage) including a difference voltage element of the first DC voltage and second DC voltage. The AGC voltage obtained here is then supplied to the high frequency amplifying stage 6 from the differential amplifying unit 3.

When the AGC voltage is supplied to the high frequency amplifying stage 6, this AGC voltage is then supplied the first gate of the double gate FET $6_1$ through the buffer resistor $6_7$. In this case, the high frequency signal supplied to the high frequency signal input terminal 7 is then supplied to the second gate of the double gate FET $6_1$ through the coupling capacitor $6_3$ and is then amplified by the double gate FET $6_1$. The amplified high frequency signal is supplied to the high frequency signal output terminal 8 through the coupling capacitor $6_4$.

Here, when a high frequency signal level to be input to the high frequency amplifying stage 6 increases, the high frequency signal level output from the high frequency amplifying stage 6 also increases and the intermediate frequency signal level to be input to the detecting circuit unit 1 also increases and thereby the first DC voltage to be supplied to the inverted input terminal (−) of the operational amplifier $3_1$ also increases. In this case, since the second DC voltage supplied to the non-inverted input terminal (+) of the operational amplifier $3_1$ is constant, the positive voltage element of the AGC voltage output from the operational amplifier $3_1$ reduces, and substantially becomes small. When a small AGC voltage is supplied to the double gate FET $6_1$, the high frequency amplifying stage 6 outputs a reduced high frequency signal level because the signal gain of the double gate FET $6_1$ is lowered as much as reduction of the AGC voltage.

On the other hand, when the high frequency signal level to be input to the high frequency amplifying stage 6 is reduced, the high frequency signal level output from the high frequency amplifying stage 6 is also reduced and the intermediate frequency signal level to be input to the detecting circuit unit 1 is also reduced and the first DC voltage supplied to the inverted input terminal (−) of the operational amplifier $3_1$ is also reduced. As a result, the positive voltage element of AGC voltage output from the operational amplifier $3_1$ increases and substantially becomes large. When this large AGC voltage is supplied to the double gate FET $6_1$, the signal gain of the double gate FET $6_1$ increases as much as increase of the AGC voltage and thereby the high frequency signal level output from the high frequency amplifying stage 6 increases.

As explained above, when the high frequency signal level to be input to the high frequency amplifying stage 6 increases, gain of the high frequency amplifying stage 6 is reduced by the AGC voltage and when the high frequency signal level to be input to the high frequency amplifying stage 6 is reduced, gain of the high frequency amplifying stage 6 is increased by the AGC voltage in order to perform the predetermined AGC operation.

Next, FIG. 2 is a voltage vs. current characteristic diagram in which change of ambient temperature in the detection diode $1_1$ and temperature compensation diode $2_1$ of the AGC circuit illustrated in FIG. 1 is defined as the parameter.

In the characteristic diagram of FIG. 2, the forward voltage (terminal voltage) indicated as V is plotted on the horizontal axis, while the forward current (bias current) indicated as mA is plotted on the vertical axis. The line a corresponds to the ambient temperature of −25° C. and the line b to the ambient temperature of +75° C.

As illustrated in the characteristic diagram of FIG. 2, when the ambient temperature is +75° C., a terminal voltage becomes 0.07V at the detection diode $1_1$ and temperature compensation diode $2_1$ for the bias current of 0.05 mA, and the terminal voltage becomes 0.14V for the bias current of 0.50 mA and when the ambient temperature is −20° C., the terminal voltage becomes 0.20V for the bias current of 0.05 mA and the terminal voltage becomes 0.26V for the bias current of 0.50 mA. As explained above, when the bias current value is different to a large extent such as 0.05 mA and 0.50 mA, if the ambient temperature changes up to +70° C. from −25° C., a rate of change of the terminal voltage is different such as 0.26−0.20 (=0.06) and 0.14−0.07 (=0.07).

In the AGC circuit illustrated in FIG. 1, the bias current of the detection diode $1_1$ is selected to 0.50 mA and the bias current of the temperature compensation diode $2_1$ is selected to 0.05 mA, respectively. When the ambient temperature changes, since change of terminal voltage of the detection diode $1_1$ is a little different from change of terminal voltage of the temperature compensation diode $2_1$ as explained above, rates of changes for variation of ambient temperatures of the first DC voltage output from the detecting circuit unit 1 and the second DC voltage output from the temperature compensation circuit unit 2 are never matched and the rages of changes cannot be canceled in the operational amplifier $3_1$. Therefore, the operational amplifier $3_1$ outputs the AGC voltage having a little temperature characteristic and then supplies this AGC voltage to the high frequency amplifying stage 6.

The high frequency amplifying stage 6 operates, when the AGC voltage having a little temperature characteristic is supplied to the double gate FET $6_1$, in such a manner that the temperature characteristic of the AGC voltage cancels the gain temperature characteristic of the amplifying stage including the double gate FET $6_1$. As a result, the predetermined AGC operation is performed in the high frequency amplifying stage 6 due to the supply of the AGC voltage having a little temperature characteristic to the high frequency amplifying stage 6 and moreover change of gain of the high frequency amplifying stage 6 for variation of ambient temperature can be controlled.

As explained above, according to the preferred embodiment of the present invention, since the bias current Id of the detection diode $1_1$ of the detecting circuit unit 1 is different, to a large extent, from the bias current Ic of the temperature compensation diode $2_1$ of the temperature compensation circuit unit 2, the AGC voltage having a little temperature characteristic can be output from the differential amplifying unit 3 to conduct the AGC operation of the high frequency amplifying stage 6 by supplying such AGC voltage having a little temperature characteristic to the high frequency amplifying stage 6. As a result, change of gain of the high frequency amplifying stage 6 for variation of ambient temperature can be controlled at the time of conducting the predetermined AGC operation and moreover the circuit configuration of the temperature compensation circuit unit 2 can also be simplified.

In the preferred embodiment of the present invention, the bias current Id of the detection diode $1_1$ is set to 0.50 mA, while the bias current Ic of the temperature compensation diode $2_1$ is set to 0.05 mA for the convenience of explanation. However, such bias current values are preferable for embodiment of the present invention but the bias current values are never limited to these values and may be changed freely depending on the operating conditions and characteristics of the diodes used.

Moreover, in the preferred embodiment of the present invention, the high frequency amplifying stage 6 is used as the gain amplifying stage to be controlled, however this gain amplifying stage to be controlled is never limited to the high frequency amplifying stage 6 and may naturally be replaced with the intermediate frequency amplifying stage.

Moreover, in the preferred embodiment of the present invention, the double gate FET $6_1$ is used as the element of amplifying stage to which the AGC voltage is supplied, but the amplifying element to which the AGC voltage is supplied is never limited to such double gate FET $6_1$ and naturally may be replaced with the other type of structural element.

According to the present invention, as explained above, the AGC voltage which changes a little for variation of ambient temperature by simplifying a circuit configuration of the compensation voltage generating unit, giving a difference between the bias current values flowing into the detection diode and temperature compensation diode and thereby setting the operation point of the temperature compensation diode to the point different from the operation point of the detection diode, such AGC voltage is supplied to the amplifying stage to be controlled in its gain in order to control the change of gain of the amplifying stage to be controlled in its gain for variation of the ambient temperature. Accordingly, the present invention provides the effect that it is now possible to obtain the AGC circuit which can not only simplify the circuit configuration of the compensation voltage generating unit but also conduct sufficient temperature compensation for variation of ambient temperature.

What is claimed is:

1. An AGC circuit with temperature compensation, comprising:
    a signal detecting unit including a detection diode to generate a detected voltage in proportion to a signal level;
    a compensation voltage generating unit including a temperature compensation diode to generate a temperature compensation voltage; said temperature compensation diode having a similar temperature characteristic as said detection diode;
        said compensation voltage generating unit having a variable voltage dividing circuit which supplies a bias voltage to the temperature compensation diode and comprising a variable resistor; and
    a differential amplifying unit for generating an AGC voltage from a difference voltage of the detected voltage and the temperature compensation voltage and then supplying this AGC voltage to a gain amplifying stage to be controlled;
    wherein a change of gain of the gain amplifying stage to be controlled due to a variation of ambient temperature is controlled by giving a temperature characteristic to the AGC voltage through a selection of resistance values of four resistors that determine a first bias current flowing into said detection diode; and
    a resistance value of said variable voltage dividing circuit being configured such that a second bias current flowing into the temperature compensation diode is smaller than the first bias current flowing into the detection diode.

2. The AGC circuit with temperature compensation according to claim 1, wherein the gain amplifying stage to be controlled is a high frequency amplifying stage including a double gate type FET having one gate receiving the AGC voltage and the other gate receiving a high frequency signal.

3. The AGC circuit with temperature compensation according to claim 1, wherein the bias current flowing into said temperature compensation diode is 1/10 of the bias current flowing into the detection diode.

4. An AGC circuit with temperature compensation, comprising:
    a signal detecting unit comprising a detection diode for generating a detected voltage;
    a compensation voltage generating unit comprising a temperature compensation diode coupled to an adjustable resistive element for generating a temperature compensation voltage;
    a positive voltage source coupled to an anode of the temperature compensation diode;
    a differential amplifying unit coupled to the detection diode and temperature compensation diode, the differential amplifying unit being configured to generate an AGC voltage from a difference voltage derived from the detected voltage and the temperature compensation voltage;
    a gain amplifying stage coupled to the differential amplifying unit;
        wherein a gain of the gain amplifying stage is configured by a temperature characteristic within the AGC voltage; and
    a resistance value of the adjustable resistive element is configured such that a second bias current flowing into the temperature compensation diode is smaller than a first bias current flowing into the detection diode.

5. The AGC circuit with temperature compensation according to claim 4, wherein the differential amplifying unit is directly coupled to the temperature compensation diode.

6. The AGC circuit with temperature compensation according to claim 4, wherein the differential amplifying unit is coupled to the detection diode directly through a resistor.

7. An AGC circuit with temperature compensation comprising:
    a signal detecting unit comprising a detection diode for generating a detected voltage;
    a compensation voltage generating unit comprising a temperature compensation diode coupled to an adjustable resistive element for generating a temperature compensation voltage;
    a differential amplifying unit coupled to the detection diode and temperature compensation diode, the differential amplifying unit being configured to generate an AGC voltage from a difference voltage derived from the detected voltage and the temperature compensation voltage;
    a gain amplifying stage coupled to the differential amplifying unit;
        wherein a gain of the gain amplifying stage is configured by a temperature characteristic within the AGC voltage; and
    a resistance value of the adjustable resistive element is configured such that a second bias current flowing into the temperature compensation diode is smaller than a first bias current flowing into the detection diode.

8. The AGC circuit with temperature compensation according to claim 7 wherein the temperature compensation diode has a similar temperature characteristic to the detection diode.

9. The AGC circuit with temperature compensation according to claim 7 wherein the compensation voltage generating unit comprises a voltage divider having an output node coupled to an anode of the temperature compensation diode.

10. The AGC circuit with temperature compensation according to claim 7 further comprising a positive voltage source coupled to an anode of the temperature compensation diode.

11. The AGC circuit with temperature compensation according to claim 7 wherein an anode of the temperature compensation diode is directly connected to ground through the adjustable resistive element and a cathode of the temperature compensation diode is directly connected to ground through a resistor.

12. The AGC circuit with temperature compensation according to claim 7, wherein the gain amplifying stage comprises a double gate type FET having a first gate coupled to the differential amplifying unit and a second gate coupled to an external signal.

13. The AGC circuit with temperature compensation according to claim 7, wherein a cathode of the temperature compensation diode is directly connected to the differential amplifying unit.

* * * * *